(12) United States Patent
Jiang

(10) Patent No.: US 7,075,343 B2
(45) Date of Patent: Jul. 11, 2006

(54) SELF-TIMED SWITCHING REGULATOR PRE-DRIVER

(75) Inventor: Xuesong Jiang, Edison, NJ (US)

(73) Assignee: Analog Devices, Inc., Norwood, MA (US)

( * ) Notice: Subject to any disclaimer, the term of this patent is extended or adjusted under 35 U.S.C. 154(b) by 101 days.

(21) Appl. No.: 11/007,602

(22) Filed: Dec. 7, 2004

(65) Prior Publication Data
US 2006/0119326 A1 Jun. 8, 2006

(51) Int. Cl.
*H03B 1/00* (2006.01)
*H03K 17/16* (2006.01)
(52) U.S. Cl. .................... 327/108; 327/109; 327/112
(58) Field of Classification Search ............... 327/108, 327/109, 112, 170; 326/26, 27
See application file for complete search history.

(56) References Cited

U.S. PATENT DOCUMENTS

| | | | | |
|---|---|---|---|---|
| 5,063,308 A | * | 11/1991 | Borkar | 326/26 |
| 5,138,194 A | * | 8/1992 | Yoeli | 326/33 |
| 5,206,544 A | * | 4/1993 | Chen et al. | 326/30 |
| 5,218,239 A | | 6/1993 | Boomer | 307/443 |
| 5,367,210 A | * | 11/1994 | Lipp | 326/26 |
| 5,534,790 A | * | 7/1996 | Huynh et al. | 326/27 |
| 5,917,361 A | * | 6/1999 | Wong et al. | 327/391 |
| 6,184,729 B1 | | 2/2001 | Pasqualini | 327/112 |
| 6,255,867 B1 | * | 7/2001 | Chen | 327/108 |
| 6,265,892 B1 | | 7/2001 | Jou et al. | 326/27 |
| 6,617,891 B1 | * | 9/2003 | Srikanth et al. | 327/108 |
| 6,707,324 B1 | * | 3/2004 | Chu | 327/108 |
| 6,809,574 B1 | * | 10/2004 | Kiani | 327/538 |
| 7,012,451 B1 | * | 3/2006 | Srikanth et al. | 327/108 |

* cited by examiner

*Primary Examiner*—Bao Q. Vu
(74) *Attorney, Agent, or Firm*—Koppel, Patrick & Heybl

(57) ABSTRACT

A switching voltage regulator includes a switching transistor connected to conduct a current (i) between a supply voltage and a first node in response to a control signal which cycles the transistor on and off, and a "pre-driver" circuit which provides the control signal. The control signal is pulled up and down with a current $I_{drv}$. The pre-driver circuit adaptively varies $I_{drv}$ such that it is at a relatively low level when the rate of change of current i (di/dt) in the switching transistor is relatively high, and is at a relatively high level when di/dt is relatively low.

23 Claims, 7 Drawing Sheets

SELF-TIMED SWITCHING REGULATOR PRE-DRIVER

BACKGROUND OF THE INVENTION

1. Field of the Invention

This invention relates to the field of switching voltage regulators, and particularly to circuits for reducing di/dt noise in such regulators.

2. Description of the Related Art

An inherent problem common to all switching voltage regulators is switching noise generated by cycling the regulator's switching transistor(s) on and off. This is particularly troublesome when integrating precision analog blocks on the same substrate as the regulator: it is difficult to isolate the analog blocks from the switching noise, which can disturb analog signals inductively, capacitively or resistively.

Several well-known techniques are available to reduce or prevent switching noise from affecting analog performance. For example, the physical spacing between the switching regulator and the analog blocks can be increased. However, this may consume an unacceptable amount of area on the chip. Alternatively, the regulator's switching frequency can be increased beyond the frequencies of the analog signals in the analog block. Unfortunately, this will require a very high switching frequency when used near wideband analog signals; as a result, the di/dt and dv/dt of the switched signals also increases, as does the magnitude of the switching noise. Another approach is to synchronize the switching frequency with clocks used with the precision analog blocks. However, since the energy of the switching noise is more or less distributed in each switching period, and since there are potentially multiple coupling paths, the benefit of synchronization may be limited.

A basic switching voltage regulator is illustrated in FIG. 1. A PMOS field-effect transistor (FET) 10 and an NMOS FET 12 are connected in series between a supply voltage VDD and ground. An inductor 14 is connected between the transistors' common node 16 and the regulator's output terminal OUT. A filter capacitor 18 is connected between OUT and ground, as is a load 20 to be driven by the regulator. A control circuit 22 receives feedback information (not shown) regarding the regulator's output, and cycles transistors 10 and 12 on and off alternately in each switching period to maintain an output with desired characteristics.

The regulator is typically connected to VDD and ground via respective bond wires 24 and 26, each of which has an inherent inductance. The operation of the regulator requires fast current switching; as such, bond wires 24 and 26 experience large current changes in a short time (large di/dt) in each switching period. This results in a large voltage drop being developed across the bond wires (V=L*di/dt). The source of switching transistor 12 is typically shorted to the substrate of the chip (as shown in FIG. 1), so that the voltage across bond wire 26 also appears on the substrate; this results in switching noise being injected into the substrate. Switching noise is also coupled into supply voltage VDD, but because PMOS switching transistor 10 is generally constructed within an "N-well", with the N-well capacitively coupled to the substrate, di/dt noise in bond wire 24 mainly affects the N-well potential rather than the substrate. Thus, di/dt-induced supply noise is not as significant as di/dt-induced ground noise.

Each switching transistor has an intrinsic body diode between its drain and its substrate (and its source when shorted to the substrate as in FIG. 1); the body diode 28 for transistor 12 is shown in FIG. 1. Switching transistor 10 sets the current through ground bond wire 26, with current conducted via bond wire 26 and body diode 28 when transistor 12 is off. Thus, it is the di/dt of switching transistor 10 that determines the amplitude and duration of any di/dt-induced ground noise—typically referred to as "ground bounce".

The di/dt of switching transistor 10 is in turn affected by the characteristics of the control signal 30 which operates it, in that di/dt will vary with the control signal's slew rate. A slow transition rate for control signal 30 reduces di/dt and thus ground bounce. However, a slow slew rate has an adverse effect on the efficiency of the regulator: a slow transition results in transistors 10 and 12 operating in a higher on-resistance region for a longer time, thus lowering efficiency.

SUMMARY OF THE INVENTION

A switching regulator pre-driver circuit is presented which overcomes the problems noted above, providing a regulator with lower di/dt-induced switching noise and higher efficiency when compared with prior art regulators.

The present invention is a switching regulator which includes a switching transistor connected to conduct a current (i) between a supply voltage and a first node in response to a control signal which cycles the transistor on and off, and a "pre-driver" circuit which provides the control signal. The regulator also includes circuitry, typically a second switching transistor, which provides a conductive path between the first node and a circuit common point such that the first switching transistor induces noise at the circuit common point that varies with di/dt.

The control signal provided by the pre-driver circuit has an associated voltage $V_{drv}$, which the pre-driver pulls up and down with a current $I_{drv}$ to cycle the switching transistor on and off. The pre-driver circuit is arranged to adaptively vary $I_{drv}$ such that current $I_{drv}$ is at a relatively low level when the rate of change of current i (di/dt) in the switching transistor is relatively high, and such that current $I_{drv}$ is at a relatively high level when di/dt is relatively low. Adaptively adjusting $I_{drv}$ in this way limits di/dt-induced noise at the circuit common point.

The pre-driver circuit is implemented such that, when a p-type switching transistor is being cycled on, current $I_{drv}$ is at a relatively low level when $V_{drv}$ is greater than a first threshold voltage, and at a relatively high level when $V_{drv}$ is less than the first threshold voltage. When cycling the transistor off, current $I_{drv}$ is at a relatively high level when $V_{drv}$ is less than a second threshold voltage, and at a relatively low level when $V_{drv}$ is greater than the second threshold voltage. Di/dt-induced noise is reduced by deriving the threshold voltages from transistors within the pre-driver circuit which emulate the behavior of the switching transistor, so that control signal slew rate is reduced when di/dt would otherwise be at its greatest.

Further features and advantages of the invention will be apparent to those skilled in the art from the following detailed description, taken together with the accompanying drawings.

BRIEF DESCRIPTION OF THE DRAWINGS

FIG. 3b is a timing diagram illustrating the operation of the pre-driver circuit of FIG. 3a.

FIGS. 3c and 3d are schematic diagrams of alternative embodiments for a current source circuit found in the pre-driver circuit shown in FIG. 3a.

DETAILED DESCRIPTION OF THE INVENTION

Figure 1:
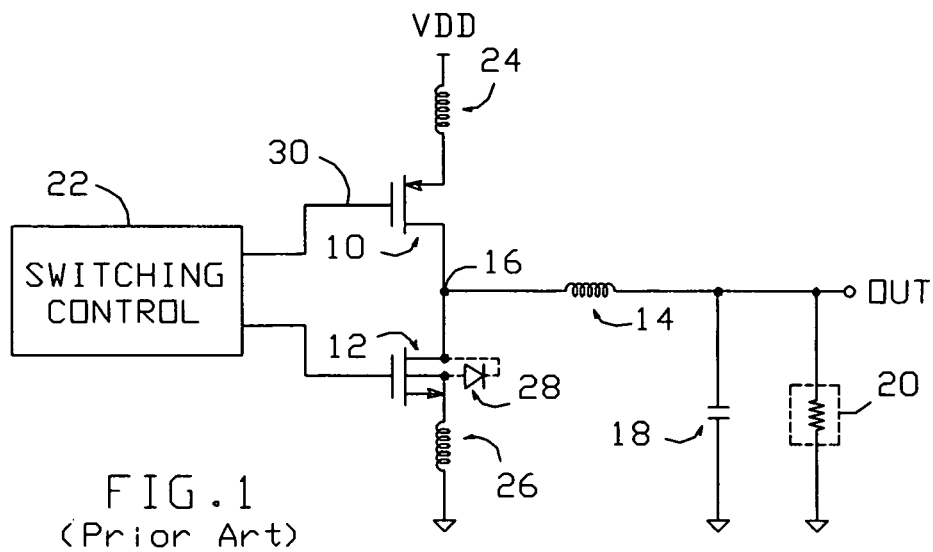
FIG. 1 is a schematic diagram of a known switching voltage regulator.
Figure 2A:
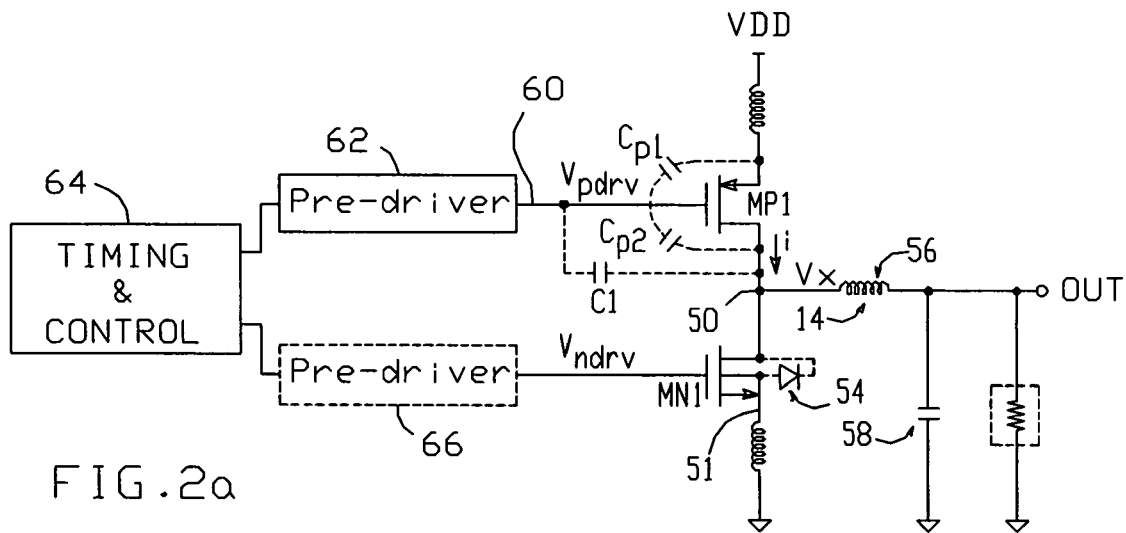
FIG. 2a is a block/schematic diagram of a switching regulator per the present invention.

A diagram depicting a switching regulator in accordance with the present invention is shown in FIG. 2a. The regulator includes a switching transistor MP1, here a PMOS FET (though the invention is equally useful with both n and p-type FETs and BJTs), connected between a supply voltage VDD and a node 50; MP1 conducts a current i to node 50. The regulator also includes circuitry 52 which provides a conductive path between node 50 and a circuit common point 51 (typically connected to ground via a bond wire); in the exemplary embodiment shown in FIG. 2a, circuitry 52 comprises a second switching transistor MN1 (with its intrinsic body diode 54). For the exemplary synchronous buck-type regulator shown in FIG. 2a, an output inductor 56 would typically be connected between node 50 and the regulator's output terminal OUT, and a filter capacitor 58 would typically be connected between OUT and ground.

Switching transistor MP1 is cycled on and off in response to a control signal 60 having a voltage $V_{pdrv}$ provided by a pre-driver circuit 62, which is in turn driven by a timing and control circuit 64. Circuit 64 typically receives feedback information (not shown) regarding the regulator's output, and operates to cycle transistors MP1 and MN1 on and off alternately in each switching period as needed to regulate the regulator's output. Transistor MN1 may be controlled by circuit 64 directly, or by a pre-driver circuit 66 driven by circuit 64. When so arranged, the switching of MP1 induces noise at circuit common point 51 which varies with the rate of change of current i in MP1—i.e., with di/dt.

Figure 2B:
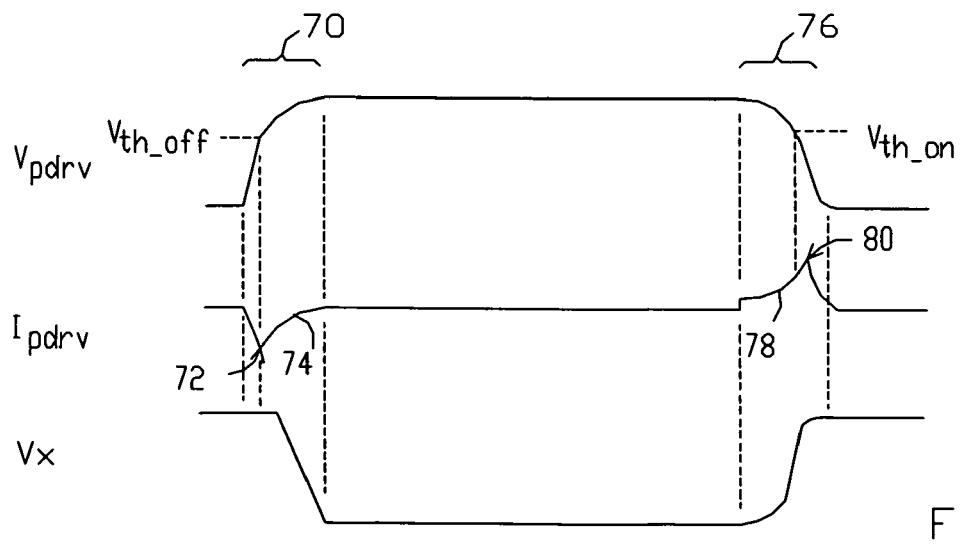
FIG. 2b is a timing diagram illustrating the operation of a switching regulator per the present invention.

Pre-driver circuit 62 is arranged to provide a control signal 60 to MP1 which reduces di/dt noise at node 51, without unduly degrading regulator efficiency. A timing diagram which depicts the basic operation of pre-driver circuit 62 is illustrated in FIG. 2b. Pre-driver circuit 62 pulls control signal voltage $V_{pdrv}$ up and down with a current $I_{pdrv}$ to cycle MP1 off and on, respectively; voltage $V_{pdrv}$, current $I_{pdrv}$, and the voltage at node 50 (denoted as "Vx") are shown in FIG. 2b for a p-type switching transistor. As shown there, pre-driver circuit 62 is arranged to adaptively vary $I_{pdrv}$ such that:

when cycling MP1 off (70) ($V_{pdrv}$ transitions from low to high), current $I_{pdrv}$ is provided at a relatively high level (72) when $V_{drv}$ is less than a threshold voltage $V_{th\_off}$, and at a relatively low level (74) when $V_{drv}$ is greater than $V_{th\_off}$;

when cycling MP1 on (76) ($V_{pdrv}$ transitions from high to low), current $I_{pdrv}$ is provided at a relatively low level (78) when $V_{pdrv}$ is greater than a threshold voltage $V_{th\_on}$, and at a relatively high level (80) when $V_{pdrv}$ is less than $V_{th\_on}$.

As seen in FIG. 2b, pre-driver circuit 62 varies current $I_{pdrv}$ adaptively, with the magnitude of $I_{pdrv}$ depending on voltage $V_{pdrv}$. In this way, the pre-driver circuit is "self-timed"—i.e., all the information needed to adjust the strength of pre-driver current $I_{pdrv}$ is derived from the voltage $V_{pdrv}$ of the pre-driver's output: control signal 60.

When threshold voltages $V_{th\_on}$ and $V_{th\_off}$ are properly selected, adaptively adjusting $I_{pdrv}$ as described above has the effect of limiting di/dt-induced noise at circuit common point 51. When turning MP1 off, $I_{pdrv}$ is provided at a relatively high level initially. During this period, the resistance of MP1 is changing very little, and thus di/dt is low. A high $I_{pdrv}$ level here tends to minimize the switching transient time. When $V_{pdrv}$ increases to a point where the resistance of MP1 begins changing rapidly ($V_{th\_off}$), the $I_{pdrv}$ level is reduced so as to minimize di/dt. Similarly, when turning MP1 on, $I_{pdrv}$ is provided at a relatively low level initially, so that MP1 is turned on slowly and di/dt is minimized. Then, when MP1 is essentially on ($V_{th\_on}$), $I_{pdrv}$ is increased to a high level to minimize switching transient time. Thus, the present pre-driver circuit tends to reduce both di/dt-induced switching noise and switching transient time.

Figure 3A:
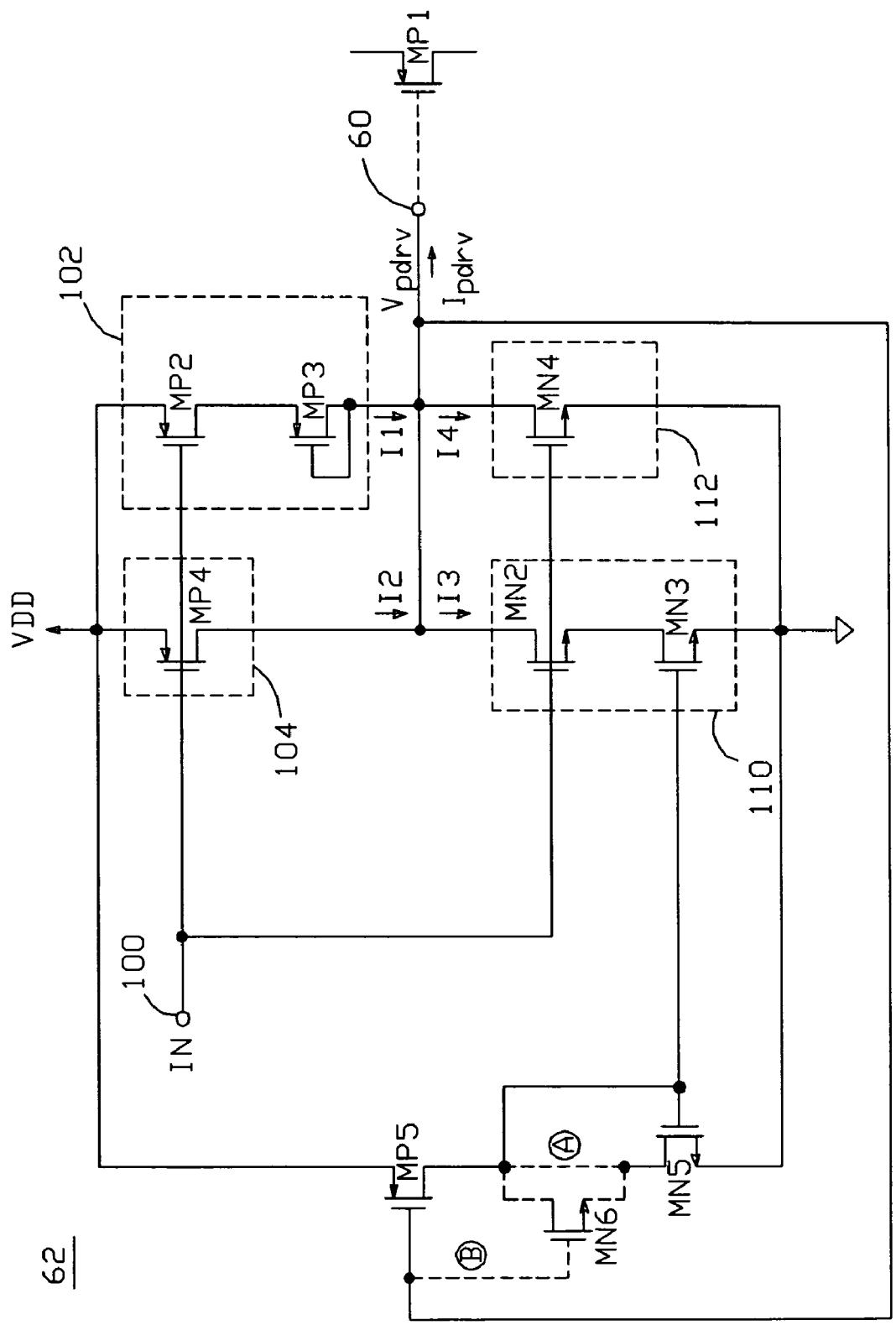
FIG. 3a is a schematic diagram of one possible embodiment of a pre-driver circuit per the present invention.

One possible implementation of pre-driver circuit 62 is shown in FIG. 3a. Circuit 62 receives an input signal IN at an input terminal 100 from timing and control block 64. In this example, when IN goes high, switching transistor MP1 is to be turned on, and when IN goes low, MP1 is to be turned off. The pre-driver circuit has a "source" side and a "sink" side. The source side comprises a first current source 102 which provides a current I1 to control signal line 60 when $V_{pdrv}$ is less than about (VDD–$V_{th}$) and IN indicates that MP1 should be cycled off, with $V_{th}$ being a known voltage. The source side also includes a second current source 104 which provides a current I2 to control signal line 60 when IN indicates that MP1 should be cycled off. The pre-driver circuit is arranged such that $I_{pdrv}$=I1+I2 when IN indicates that MP1 should be cycled off.

In the exemplary embodiment shown in FIG. 3a, current source 102 is implemented with a PMOS FET MP2 connected between VDD and a diode-connected FET MP3, the drain/gate of which is connected to control signal line 60. Current source 104 is implemented with a PMOS FET MP4 connected between VDD and line 60. Input signal IN is applied to the gates of MP2 and MP4.

In operation, when the voltage $V_{pdrv}$ on control signal line 60 is low (such that MP1 is on) and IN goes low (indicating that MP1 is to be turned off), the gate-source and drain-source voltages of MP3 will be large enough to turn MP3 on. With IN low, MP2 and MP4 will also be turned on. Under these conditions, MP2 and MP3 will conduct a non-zero current I1 to control signal line 60, and MP4 will conduct a non-zero current I2 to line 60, so that the current provided to control signal line 60 is equal to I1+I2. This corresponds to a relatively high $I_{pdrv}$ current.

Currents I1 and I2 will cause $V_{pdrv}$ to begin to increase. When $V_{pdrv}$ increases to about (VDD–$V_{th}$), where $V_{th}$ is the threshold voltage of MP3, MP3 will shut off and current I1 goes to zero. Now, only I2 is conducted to control line 60, which corresponds to a relatively low $I_{pdrv}$ current. The sizes of MP2, MP3 and MP4 can be selected as needed to obtain a desired relationship between I1 and I2.

As noted above, when turning MP1 off, an objective of the pre-driver circuit is to provide current $I_{pdrv}$ at a relatively high level when $V_{pdrv}$ is less than a particular threshold voltage, and providing $I_{pdrv}$ at a relatively low level when $V_{pdrv}$ is greater than the threshold voltage. The relatively low $I_{pdrv}$ level is preferably provided when the rate of change for the current in MP1 is at its highest, to reduce the di/dt-induced noise that arises from switching MP1. The behavior of MP1 is best emulated by using another PMOS FET with a similar threshold voltage—here, MP3—such that MP3 shuts down and current $I_{pdrv}$ decreases just as the rate of change of current in MP1 is about to increase.

The "sink" side of pre-driver circuit 62 operates similarly. The sink side includes a third current source 110 which provides a current I3 to control signal line 60 when $V_{pdrv}$ is less than about (VDD–$V_{th2}$) and IN indicates that MP1 should be cycled on, with $V_{th2}$ being a known voltage. The sink side also includes a fourth current source 112 which provides a current I4 to control signal line 60 when IN indicates that MP1 should be cycled on. The pre-driver circuit is arranged such that $I_{pdrv}$=I3+I4 when IN indicates that MP1 should be cycled on.

In the exemplary embodiment shown in FIG. 3a, current source 110 is implemented with a NMOS FET MN2 connected between control signal line 60 and a NMOS FET MN3, the source of which is connected to ground. Current source 112 is implemented with a NMOS FET MN4 connected between line 60 and ground. Input signal IN is applied to the gates of MN2 and MN4; the connection to the gate of MN3 is discussed below.

A PMOS FET MP5 is used to emulate the behavior of MP1 and thereby approximately detect when the rate of change of current in MP1 is about to increase. MP5's gate is connected to control signal line 60, and its source is connected to VDD. When the drain of MP5 is shorted to the drain of MN5 (indicated as option "A" in FIG. 3a), current through MP5 is mirrored to MN3 via MN5. A preferred embodiment using an optional FET MN6 is discussed below (indicated as option "B" in FIG. 3a).

In operation, when the voltage $V_{pdrv}$ on control signal line 60 is high (such that MP1 is off) and IN goes high (indicating that MP1 is to be turned on), MP5 will be off. As a result, no current is mirrored to MN3, current source 110 is off, and I3 is zero. With IN high, MN4 will be on and conducting a non-zero current I4 to control signal line 60. Under these conditions, the current provided to control signal line 60 is equal to I3+I4; with I3=0, this corresponds to a relatively low $I_{pdrv}$ current.

Current I4 will cause $V_{pdrv}$ to begin to decrease. When $V_{pdrv}$ decreases to about (VDD–$V_{th2}$), where $V_{th2}$ is the threshold voltage of MP5, MP5 will begin to conduct a current that is mirrored to MN3, causing the I3 current conducted by current source 110 to increase from zero. With both current sources 110 and 112 now conducting, the current provided to control signal line 60, equal to I3+I4, corresponds to a relatively high $I_{pdrv}$ current. The sizes of MN2–MN5 and MP5 can be selected as needed to obtain a desired relationship between I3 and I4.

This sink side arrangement serves to achieve the objective noted above for turning MP1 on: to provide current $I_{pdrv}$ at a relatively low level when the rate of change for the current in MP1 is at its highest—to reduce the di/dt-induced noise that arises from switching MP1, and to provide current $I_{pdrv}$ at a relatively high level otherwise—to reduce switching transient time.

Figure 3B:
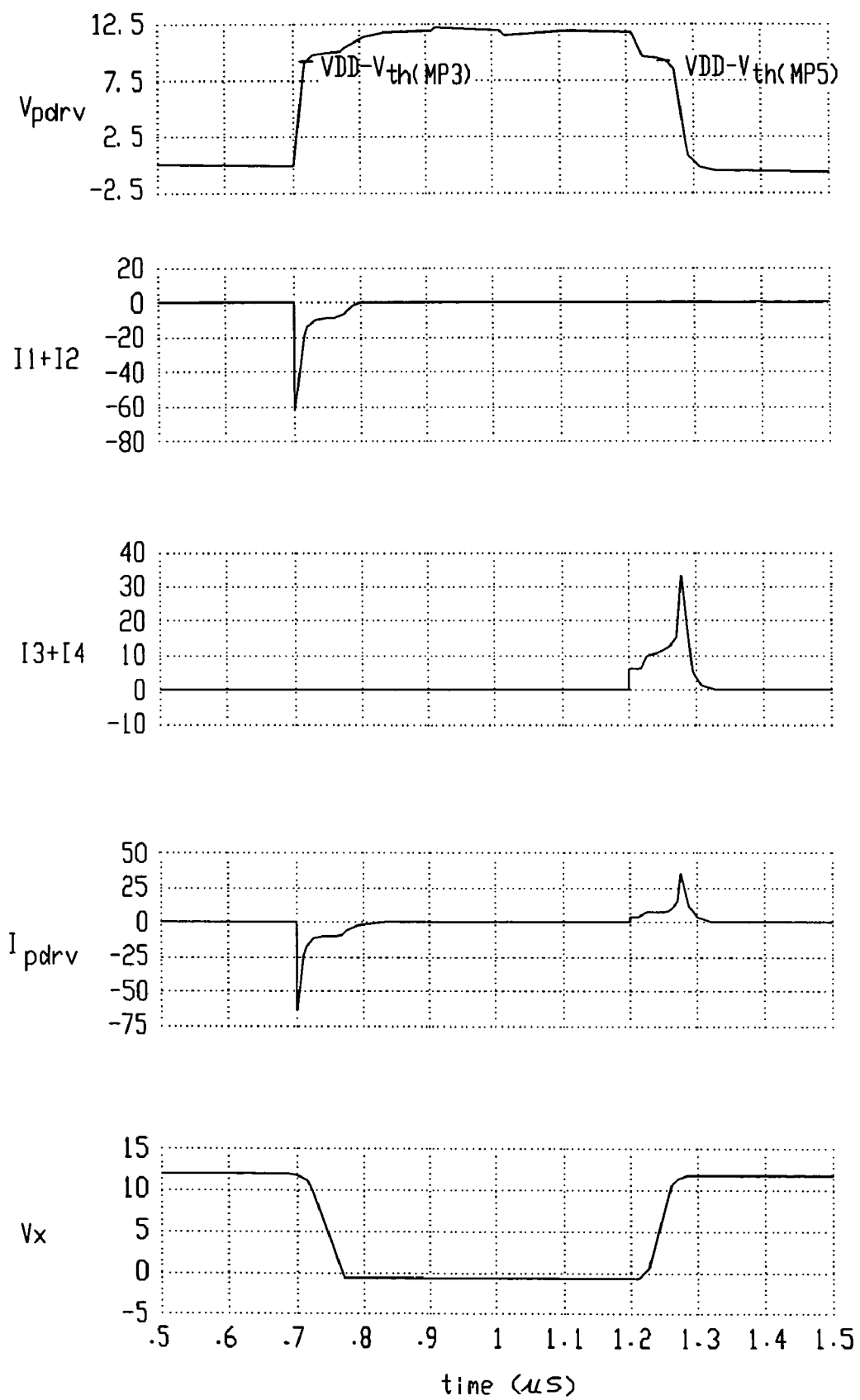

A simulation of the operation of pre-driver circuit 62 when cycling MP1 off and on is shown in FIG. 3b. As described above, when turning MP1 off, $I_{pdrv}$=I1+I2 is initially relatively high. However, when $V_{pdrv}$ is greater than (VDD–$V_{th(Mp3)}$), current I1 goes to zero and the rate of change for control signal line voltage $V_{pdrv}$ decreases to reduce di/dt noise. When turning MP1 on, $I_{pdrv}$=I3+I4 is initially relatively low, because I3=0; this reduces di/dt for MP1. However, when $V_{pdrv}$ is less than (VDD–$V_{th(MP5)}$), I3 becomes non-zero, $I_{pdrv}$ becomes relatively high, and the rate of change for control signal line voltage $V_{pdrv}$ increases to reduce switching transient time.

In a preferred embodiment, the drain of MP5 is not shorted to the drain of MN5 (as per option "A"), but rather a NMOS FET MN6 is connected between MP5 and MN5 (indicated as option "B" in FIG. 3a). When so arranged, when $V_{pdrv}$ is below (VDD–$V_{th\_pmos}$) (where $V_{th\_PMOS}$ is the threshold voltage of PMOS FET MP5), MP5 turns on. MP5's drain current will take two paths: to the gate of MN5 or to the drain of MN5 (assuming MN6 is at least partially on). If $V_{pdrv}$ is not low enough to turn off MN6, MN6 acts as a resistor, MP5's drain current flows through the drain of MN5, and MN5's gate voltage is set by the MP5 current. As $V_{pdrv}$ continues to decrease, MP5's drain current increases, as does the resistance of MN6. As a result, the gate voltage of MN5 increases. When $V_{pdrv}$ is low enough such that the resistance of MN6 starts to limit the current through MN5, MP5's drain current is forced to the gate of MN5 and raises MN5's (and MN3's) gate voltage to VDD. When $V_{pdrv}$ is below $V_{th\_NMOS}$ (where $V_{th\_NMOS}$ is the threshold voltage of NMOS FET MN6), MN6 is completely turned off, there is no current through MN5, and the gate voltages of MN5 and MN3 is VDD. Thus, after $V_{pdrv}$ has transitioned from high to low, FET MN6 prevents current from flowing through MN5 and ensures that the gate voltage of MN3 is at VDD.

Figure 3C:
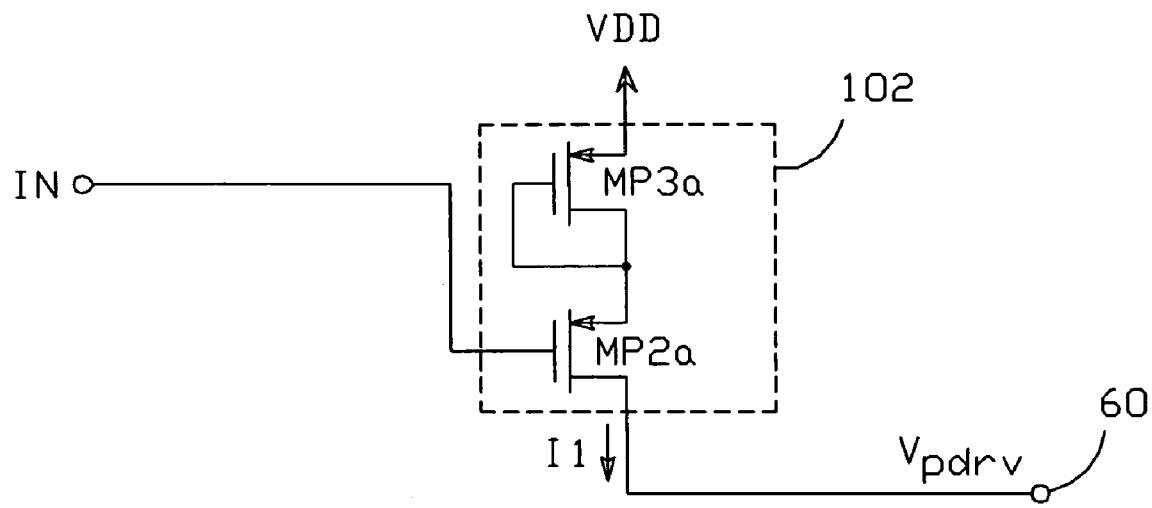
Figure 3D:
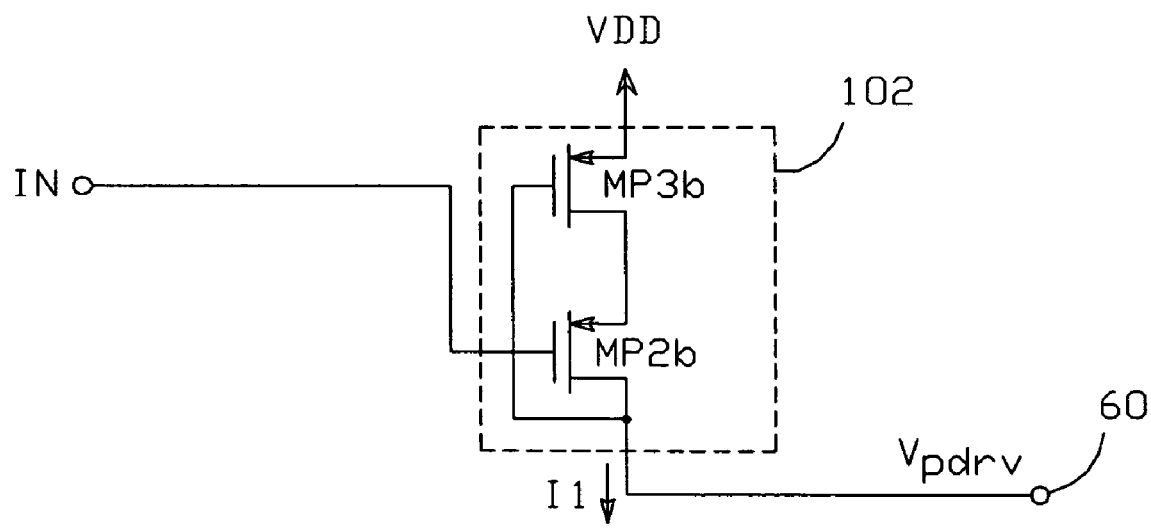

Note that pre-driver circuit 62 can be implemented in many different ways. For example, two alternative embodiments of current source 102 are shown in FIGS. 3c and 3d. As in FIG. 3a, both of these embodiments conduct a non-zero I1 current to control signal line 60 when $V_{pdrv}$ is below about (VDD–$V_{th}$), where $V_{th}$ is the threshold voltage of MP3a (in FIG. 3c) or MP3b (in FIG. 3d). However, when $V_{pdrv}$ increases to about (VDD–$V_{th}$), MP3 will shut off and current I1 goes to zero.

Figure 4A:
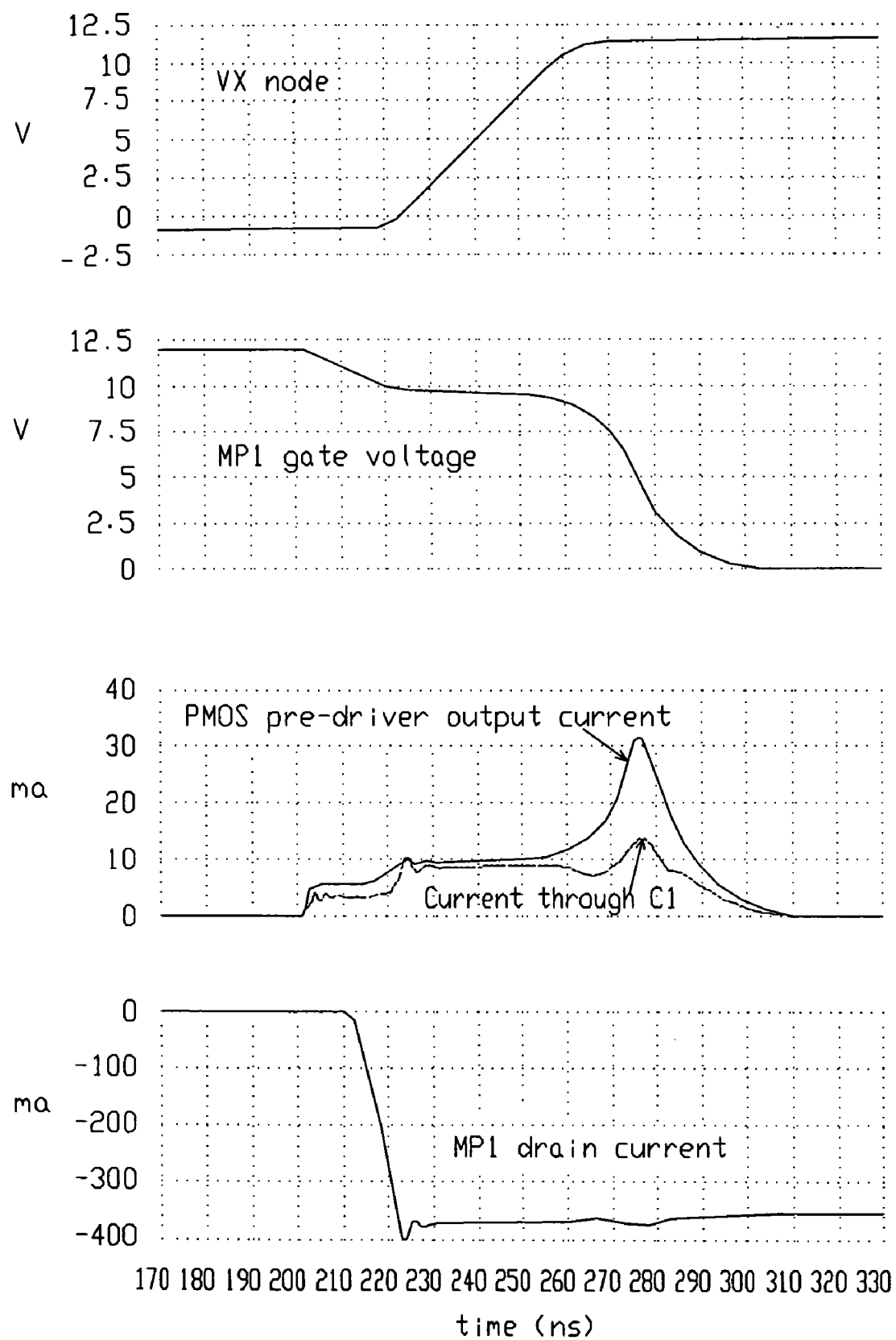
FIGS. 4a and 4b are timing diagrams illustrating the operation of the present pre-driver circuit's intrinsic clamping mechanism during negative and positive control signal transitions, respectively.
Figure 4B:
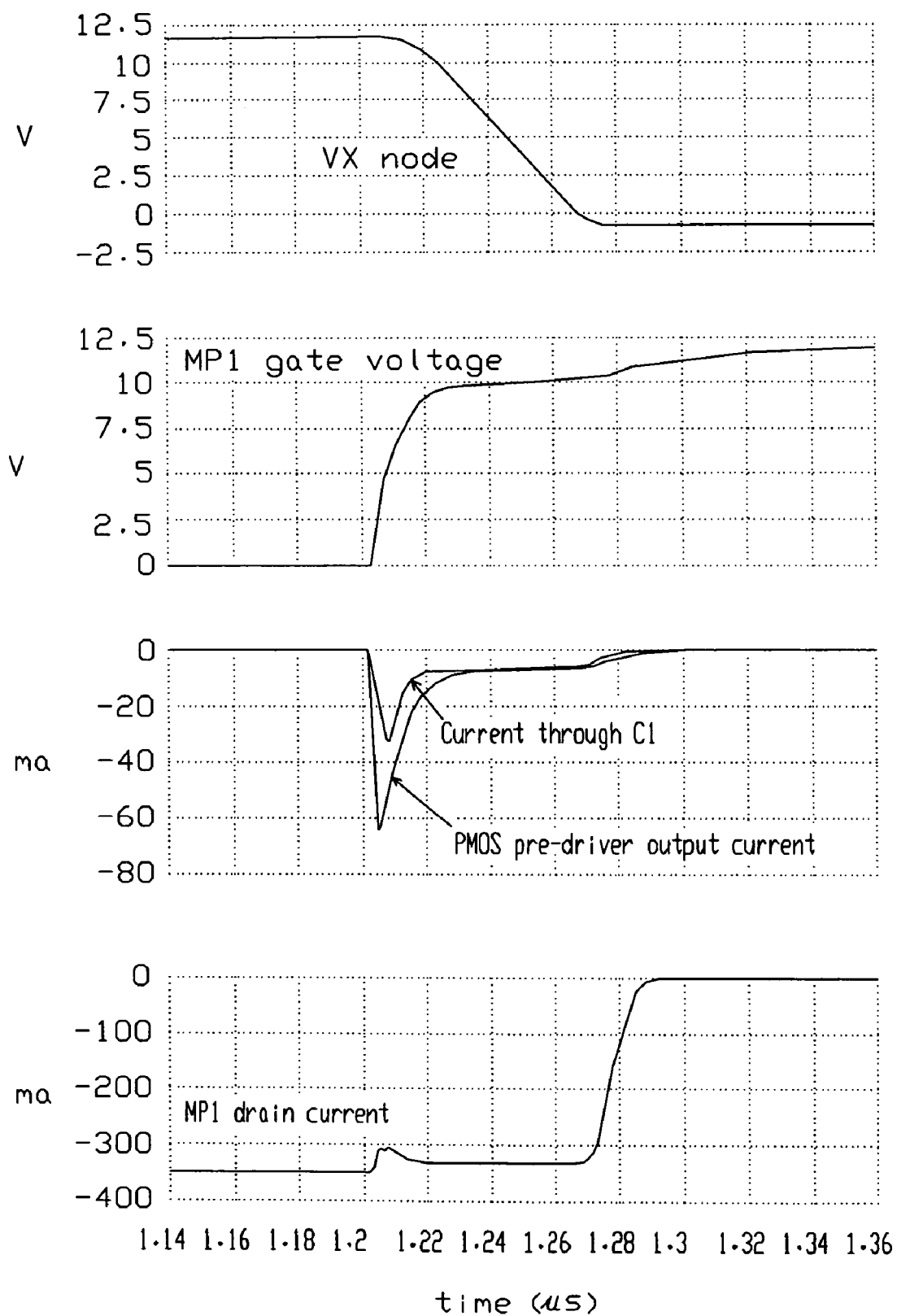

When the present pre-driver is arranged as shown in FIG. 3a, an intrinsic clamping mechanism comes into play whenever the voltage Vx at node 50 transitions between its "high" (near VDD) and "low" (near ground) states, which acts to weaken or negate the strength of the pre-driver output during such transitions and thus further reduces di/dt-induced noise. The operation of the clamping mechanism is illustrated in FIG. 4a for when MP1 is turned on, and in FIG. 4b for when MP1 is turned off. With reference to FIG. 2a, some capacitance is present between MP1's gate and its drain and source terminals. This capacitance may consist solely of the parasitic capacitance ($C_{p1}$, $C_{p2}$) that is inherently present between a FET's gate and its drain and source terminals, or may also include a intentionally added capacitance C1 connected between MP1's gate and drain. When voltage Vx is not changing, pre-driver output current $I_{pdrv}$ charges MP1's gate-source and gate-drain capacitances ($C_{p1}$ and $C_{p2}$), as well as C1 (if present). Under these conditions, the gate voltage of MP1 ($V_{pdrv}$) changes at a rate dependent on $I_{pdrv}$ and the total MP1 gate capacitance.

However, when voltage Vx transitions, the rate at which Vx changes causes an additional current to flow through MP1's gate-drain capacitance, and through C1 (if present). As a result, $I_{pdrv}$ has to supply this additional current, and less current is available to charge the MP1 gate capacitance—thereby reducing the rate of change of $V_{pdrv}$. As Vx transitions, its rate of change will reach a steady state: at that point, the current flowing through MP1's gate-drain capacitance and through C1 is equal to $I_{pdrv}$. As such, during this period, none of the pre-driver output current is being used to charge MP1's gate-source capacitance, and the rate of change of $V_{pdrv}$—and of MP1's drain current—is zero; this period is referred to as the "clamping" period. During the clamping period, the pre-driver circuit does not provide any current to change MP1's gate voltage, the pre-driver strength is essentially zero, and MP1's gate voltage will be kept almost constant.

Note that capacitor C1 is not essential to the operation of the present pre-driver circuit. However, some capacitance between MP1's gate and drain is needed for the clamping mechanism described above to work. Adding capacitor C1 increases MP1's gate-drain capacitance, which increases the duration of the clamping period and thus acts to further reduce the rate of change of Vx, and thereby reduce electromagnetic interference due to fast switching.

As noted above, NMOS switching transistor 12 has less of an impact on di/dt-induced noise that does PMOS switching transistor 10. However, to further improve regulator performance, a pre-driver 66 similar to pre-driver 62 can be used to drive NMOS switching transistor 12.

Figure 5:
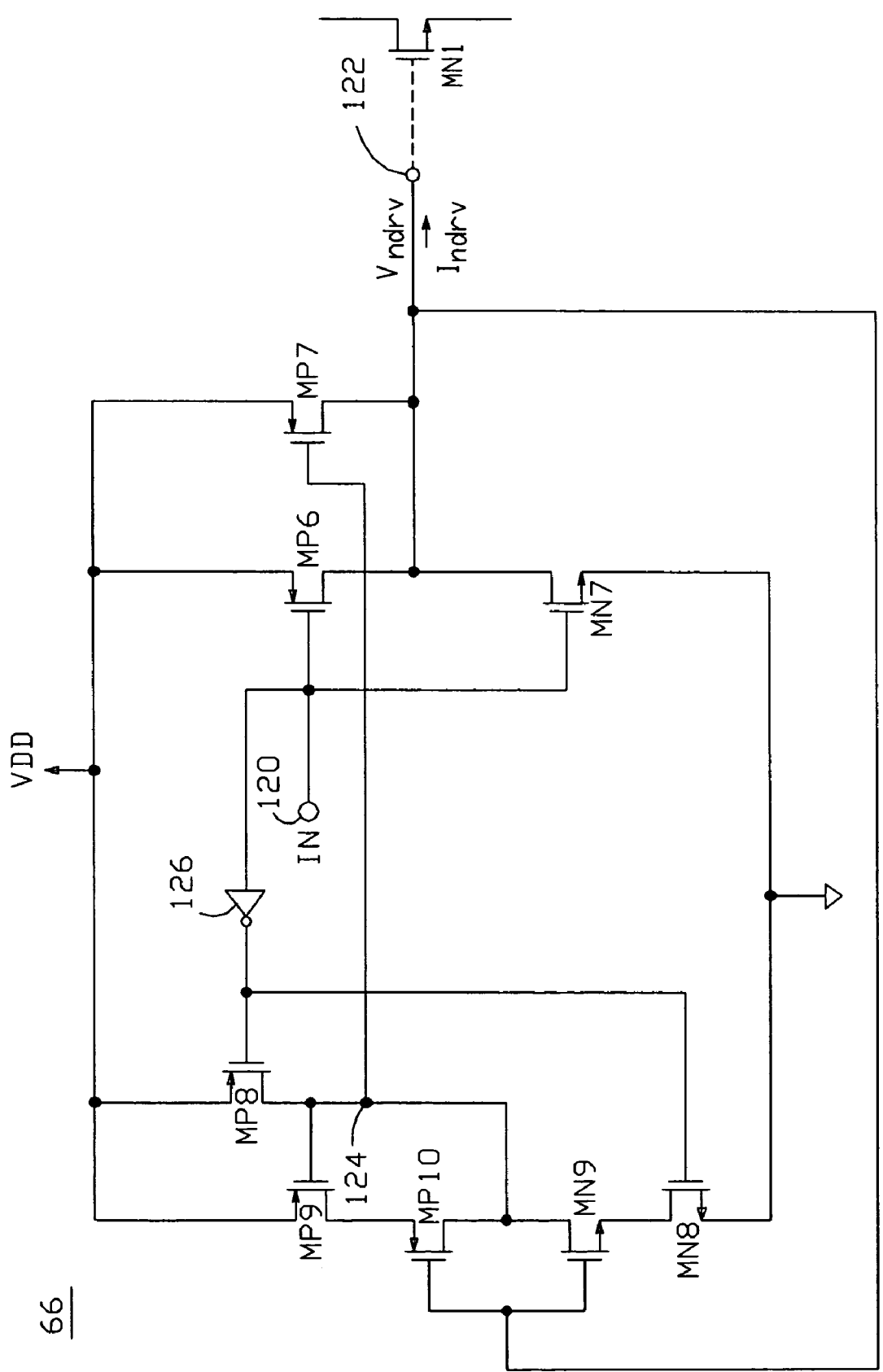
FIG. 5 is a schematic diagram of a pre-driver circuit as might be used to drive a second switching transistor.

One possible embodiment of such a pre-driver 66 is shown in FIG. 5. The circuit receives input signal IN at an input terminal 120 from timing and control block 64. In this example, when IN goes high, switching transistor MN1 is to be turned off, and when IN goes low, MN1 is to be turned on. Input signal IN is connected to a PMOS FET MP6 and an NMOS FET MN7; MP6 is connected between VDD and the pre-driver's output 122, and MN7 is connected between output 122 and ground; the voltage at output 122 is denoted "$V_{ndrv}$". When IN is high, MN7 pulls down on $V_{ndrv}$, and when IN is low, MP6 pulls up on $V_{ndrv}$.

To improve regulator performance, a PMOS FET MP7 is connected between VDD and output 122, and is turned on when MN1 is being turned on and $V_{ndrv}$ increases to about $V_{th\_NMOS}$, where $V_{th\_NMOS}$ is the threshold voltage of MN1. When on, MP7 increases the magnitude of the pre-driver circuit's output current $I_{ndrv}$, thereby providing extra charging current to charge MN1's gate-source parasitic capacitance, which reduces the transition time of $V_{ndrv}$ and improves the regulator's efficiency.

A PMOS FET MP8 is connected between VDD and a node 124, which is connected to the gate of MP7. When IN is high (indicating that MN1 is to be off), the output of an inverter 126 turns MP8 on, which pulls up on the gate of MP7, keeping it off.

When MN1 is on, IN is low, the output of inverter 126 is high, and an NMOS FET MN8 is turned on. In this case, the voltage at node 124 depends on the value of $V_{ndrv}$. This relationship is determined using PMOS FETs MP9 and MP10 connected in series between VDD and node 124, with MP9's gate connected to node 124 and MP10's gate connected to output 122, and an NMOS FET MN9 connected between node 124 and MN8, with MN9's gate connected to output 122.

In operation, IN transitions from high to low to begin the process of turning on MN1. This turns MN8 on and MP8 off. Initially, $V_{ndrv}$ is at or near ground. While $V_{ndrv}$ is below $V_{th\_NMOS}$ (where $V_{th\_NMOS}$ is the threshold voltage of MN9, which mimics the behavior of switching transistor MN1), MN9 is off, there is no current through MP9 and MP10, and thus no current through MP7. When $V_{ndrv}$ increases to about $V_{th\_NMOS}$, MN9 comes on and its drain current is mirrored through MP9 to MP7. As $V_{ndrv}$ continues to increase, the resistance of MP10 starts to limit the current through MP9, the MN9 drain current will pull node 124 towards ground, and the current through MP7 increases. When $V_{ndrv}$ becomes greater than (VDD–$V_{th\_PMOS}$), MP10 is completely turned off, there is no current through MP9, node 124 is at ground, and MP7 is completely turned on—making $I_{ndrv}$ relatively high.

When so arranged, the regulator's efficiency is improved as noted above. The implementation shown in FIG. 5 also acts to ensure that the transition times and the ground bounces that occur when turning MN1 on and turning MN1 off are about equal.

Though the present pre-driver circuits are shown in use with a synchronous buck-type switching regulator, the invention is not limited to this regulator configuration. The pre-driver circuits described herein could be used with any switching regulator configuration to reduce the di/dt-induced noise generated by one or more switching transistors.

The particular pre-driver circuit implementations depicted herein are merely exemplary. Both PMOS pre-driver 62 and NMOS pre-driver 66 could be implemented in many different ways. It is only essential that the pre-drivers be arranged such that their output current(s) adjust adaptively to limit di/dt-induced noise created by the regulator's switching transistor(s).

While particular embodiments of the invention have been shown and described, numerous variations and alternate embodiments will occur to those skilled in the art. Accordingly, it is intended that the invention be limited only in terms of the appended claims.

I claim:

1. A switching regulator, comprising:
a first switching transistor connected to conduct a current (i) between a supply voltage VDD and a first node in response to a first control signal which cycles said transistor on and off;
circuitry which provides a conductive path between said first node and a circuit common point such that said first switching transistor induces noise at said circuit common point that varies with di/dt; and
a pre-driver circuit connected to provide said first control signal to said first switching transistor, said first control signal having a voltage $V_{drv}$ which said pre-driver circuit pulls up and down with a current $I_{drv}$ to cycle said first switching transistor on and off, said pre-driver circuit arranged to adaptively vary $I_{drv}$ such that current $I_{drv}$ is at a relatively low level when the rate of change of current i (di/dt) in said first switching transistor is relatively high and such that said current $I_{drv}$ is at a relatively high level when di/dt is relatively low, such that said adaptive adjustment of $I_{drv}$ limits di/dt-induced noise at said circuit common point.

2. The regulator of claim 1, wherein said circuitry which provides a conductive path between said first node and a circuit common point comprises a second switching transistor which is cycled on and off in response to a second control signal.

3. The regulator of claim 1, wherein said first switching transistor is a p-type transistor, said pre-driver circuit arranged such that:
when cycling said transistor off, said current $I_{drv}$ is at a relatively high level when $V_{drv}$ is less than a first threshold voltage and current $I_{drv}$ is at a relatively low level when $V_{drv}$ is greater than said first threshold voltage; and
when cycling said transistor on, said current $I_{drv}$ is at a relatively low level when $V_{drv}$ is greater than a second threshold voltage and current $I_{drv}$ is at a relatively high level when $V_{drv}$ is less than said second threshold voltage.

4. The regulator of claim 3, wherein said first switching transistor is a PMOS field-effect transistor (FET).

5. The regulator of claim 4, wherein said first and second threshold voltages are derived from the threshold voltages of respective FETs within said pre-driver circuit.

6. The regulator of claim 3, wherein said pre-driver circuit comprises:
an input terminal for receiving an input signal which indicates when said first switching transistor should be cycled on and off;
an output terminal at which said first control signal is provided;
a "source" side comprising:
a first current source which provides a non-zero current I1 to said output terminal when $V_{drv}$ is less than said first threshold voltage and said input signal indicates that said first switching transistor should be cycled off, said first threshold voltage being approximately equal to (VDD−$V_{th1}$) where $V_{th1}$ is a known voltage; and
a second current source which provides a non-zero current I2 to said output terminal when said input signal indicates that said first switching transistor should be cycled off, said pre-driver circuit arranged such that $I_{drv}$=I1+I2 when said input signal indicates that said first switching transistor should be cycled off; and
a "sink" side comprising:
a third current source which provides a non-zero current I3 to said output terminal when $V_{drv}$ is less than said second threshold voltage and said input signal indicates that said first switching transistor should be cycled on, said second threshold voltage being approximately equal to (VDD−$V_{th2}$) where $V_{th2}$ is a known voltage; and
a fourth current source which provides a non-zero current I4 to said output terminal when said input signal indicates that said first switching transistor should be cycled on, said pre-driver circuit arranged such that $I_{drv}$=I3+I4 when said input signal indicates that said first switching transistor should be cycled on.

7. The regulator of claim 6, wherein said first current source comprises:
a first PMOS field-effect transistor (FET) having its gate connected to receive a signal which varies with said input signal and its drain-source circuit connected between VDD and a second node; and
a second diode-connected PMOS FET having its drain-source circuit connected between said second node and said output terminal;
such that said first and second PMOS FETs conduct said non-zero current I1 to said output terminal when $V_{drv}$ is less than about (VDD−$V_{th1}$) and said input signal indicates that said first switching transistor should be cycled off, $V_{th1}$ being the threshold voltage of said second PMOS FET.

8. The regulator of claim 6, wherein said first current source comprises:
a first diode-connected PMOS field-effect transistor (FET) having its drain-source circuit connected between VDD and a second node; and
a second PMOS FET having its gate connected to receive a signal which varies with said input signal and its drain-source circuit connected between said second node and said output terminal;
such that said first and second PMOS FETs conduct said non-zero current I1 to said output terminal when $V_{drv}$ is less than about (VDD−$V_{th1}$) and said input signal indicates that said first switching transistor should be cycled off, $V_{th1}$ being the threshold voltage of said first PMOS FET.

9. The regulator of claim 6, wherein said first current source comprises:
a first PMOS field-effect transistor (FET) having its gate connected to said output terminal and its drain-source circuit connected between VDD and a second node; and
a second PMOS FET having its drain-source circuit connected between said second node and said output terminal and its gate connected to receive a signal which varies with said input signal;
such that said first and second PMOS FETs conduct said non-zero current I1 to said output terminal when $V_{drv}$ is less than about (VDD−$V_{th1}$) and said input signal indicates that said first switching transistor should be cycled off, $V_{th1}$ being the threshold voltage of said first PMOS FET.

10. The regulator of claim 6, wherein said second current source comprises a PMOS field-effect transistor (FET) having its gate connected to receive a signal which varies with said input signal and its drain-source circuit connected between VDD and said output terminal such that said FET conducts said non-zero current I2 to said output terminal when said input signal indicates that said first switching transistor should be cycled off.

11. The regulator of claim 6, wherein said third current source comprises:
a first NMOS field-effect transistor (FET) having its gate connected to receive a signal which varies with said input signal and its drain-source circuit connected between said output terminal and a second node;
a second NMOS FET having its drain-source circuit connected between said second node and said circuit common point; and
circuitry arranged to turn on said second NMOS FET when $V_{drv}$ is less than about (VDD−$V_{th2}$);
such that said first and second NMOS FETs conduct said non-zero current I3 from said output terminal when $V_{drv}$ is less than about (VDD−$V_{th2}$) and said input signal indicates that said first switching transistor should be cycled on.

12. The regulator of claim 11, wherein said circuitry arranged to turn on said second NMOS FET comprises:
a first PMOS FET having its gate connected to said output terminal and its drain-source circuit connected between VDD and a third node; and
a third NMOS FET connected between said third node and said circuit common point and arranged to form a current mirror with said second NMOS FET such that the current in said first PMOS FET is mirrored to said second NMOS FET and such that said second NMOS FET is turned on and conducts said non-zero current I3 when $V_{drv}$ is less than about (VDD−$V_{th2}$), $V_{th2}$ being the threshold voltage of said first PMOS FET.

13. The regulator of claim 12, wherein said circuitry further comprises a fourth NMOS FET having its gate connected to said output terminal and its drain-source circuit connected between said third node and the drain of said third NMOS FET such that said fourth NMOS FET prevents current from flowing through said third NMOS FET when $V_{drv}$ is pulled down.

14. The regulator of claim 6, wherein said fourth current source comprises a NMOS field-effect transistor (FET) having its gate connected to receive a signal which varies with said input signal and its drain-source circuit connected between said output terminal and said circuit common point such that said NMOS FET conducts said non-zero current I4 from said output terminal when said input signal indicates that said first switching transistor should be cycled on.

15. The regulator of claim 1, wherein said first node transitions between first and second states in response to said first switching transistor being cycled on and off, further comprising a capacitance connected between said first node and said control signal which diverts a portion of $I_{drv}$ from said first switching transistor and thereby reduces the rate of change of $V_{drv}$ while the voltage at said first node transitions between said first and second states.

16. The regulator of claim 15, wherein said capacitance comprises the intrinsic parasitic capacitance present between the terminals of said first switching transistor.

17. The regulator of claim 16, wherein said capacitance further comprises a capacitor connected between said first node and said control signal.

18. The regulator of claim 1, wherein said circuitry which provides a conductive path between said first node and a circuit common point comprises a second switching transistor which is cycled on and off in response to a second control signal, further comprising an inductor connected between said first node and said regulator's output terminal, said regulator arranged to operate as a synchronous buck regulator.

19. The regulator of claim 1, wherein said circuitry which provides a conductive path between said first node and a circuit common point comprises a second, n-type switching transistor which is cycled on and off in response to a second control signal, said regulator further comprising a second pre-driver circuit connected to provide said second control signal to said second switching transistor, said second control signal having a voltage $V_{drv2}$ which said second pre-driver circuit pulls up and down with a current $I_{drv2}$ to cycle said second switching transistor on and off, said second pre-driver circuit arranged to adaptively vary $I_{drv2}$ such that, when cycling said second switching transistor on, $I_{drv}$ is at a relatively low level when $V_{drv2}$ is less than a threshold voltage $V_{th3}$, where $V_{th3}$ is a known voltage, and is at a relatively high level when $V_{drv2}$ is greater than $V_{th3}$, such that said adaptive adjustment of $I_{drv}$ improves regulator efficiency.

20. The regulator of claim 19, wherein said second switching transistor is a NMOS field-effect transistor and $V_{th3}$ is approximately equal to the threshold voltage of said second switching transistor.

21. A synchronous buck switching regulator with a pre-driver circuit, comprising:
 a first p-type switching transistor connected to conduct a current (i) between a supply voltage VDD and a first node in response to a first control signal which cycles said first transistor on and off;
 a second n-type switching transistor connected to conduct current between said first node and a circuit common node in response to a second control signal which cycles said second on and off, said second transistor providing a conductive path between said first node and said circuit common point such that said first switching transistor induces noise at said circuit common point that varies with di/dt;
 an inductor connected between said first node and an output terminal; and
 a pre-driver circuit connected to provide said first control signal to said first switching transistor, said first control signal having a voltage $V_{drv}$ which said pre-driver circuit pulls up and down with a current $I_{drv}$ to cycle said first switching transistor on and off, said pre-driver circuit arranged to adaptively vary $I_{drv}$ such that:
  when cycling said first switching transistor off, said current $I_{drv}$ is at a relatively high level when $V_{drv}$ is less than a first threshold voltage and current $I_{drv}$ is at a relatively low level when $V_{drv}$ is greater than said first threshold voltage; and
  when cycling said first switching transistor on, said current $I_{drv}$ is at a relatively low level when $V_{drv}$ is greater than a second threshold voltage and current $I_{drv}$ is at a relatively high level when $V_{drv}$ is less than said second threshold voltage;
  such that said adaptive adjustment of $I_{drv}$ limits di/dt-induced noise at said circuit common point.

22. The regulator of claim 21, wherein said first switching transistor is a PMOS field-effect transistor (FET) and said second switching transistor is a NMOS FET.

23. The regulator of claim 22, wherein said first and second threshold voltages are derived from the threshold voltages of respective FETs within said pre-driver circuit.

* * * * *